United States Patent
Huang

(10) Patent No.: US 11,581,884 B1
(45) Date of Patent: Feb. 14, 2023

(54) BOOTSTRAPPED SWITCH

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/828,472

(22) Filed: May 31, 2022

(51) Int. Cl.
*H03K 17/04* (2006.01)
*H03K 19/01* (2006.01)

(52) U.S. Cl.
CPC ............. *H03K 17/04* (2013.01); *H03K 19/01* (2013.01)

(58) Field of Classification Search
CPC .................. H03K 17/04; H03K 17/041; H03K 17/04106; H03K 17/06; H03K 17/063; H03K 17/10; H03K 17/102; H03K 17/12; H03K 17/122; H03K 17/14; H03K 17/145; H03K 17/16; H03K 17/161; H03K 17/162; H03K 17/687; H03K 17/6871; H03K 17/6872; H03K 19/01; H03K 19/017; H03K 19/01707; H03K 19/01714; H03K 19/01728; H03K 19/01735; H03K 4/24; H03K 4/58
See application file for complete search history.

(56) References Cited

U.S. PATENT DOCUMENTS

| | | | |
|---|---|---|---|
| 9,147,497 B1* | 9/2015 | Oo | ........................ H03K 17/063 |
| 11,070,207 B2* | 7/2021 | Huang | ............. H03K 19/01735 |
| 2006/0202736 A1 | 9/2006 | Aksin | |
| 2021/0105014 A1 | 4/2021 | Huang | |

FOREIGN PATENT DOCUMENTS

TW 202116019 A 4/2021

* cited by examiner

*Primary Examiner* — Long Nguyen
(74) *Attorney, Agent, or Firm* — WPAT, PC

(57) ABSTRACT

A bootstrapped switch includes a first transistor, a second transistor, a first capacitor, three switches, and a switch circuit. The switch circuit includes a first switch, a second switch, a second capacitor, and an inverter circuit. The first transistor receives the input voltage and outputs the output voltage. The first terminal of the second transistor receives the input voltage, and the second terminal of the second transistor is coupled to the first terminal of the first capacitor. The control terminal of the first switch receives a clock. The first switch is coupled between a node and a reference voltage. The second switch is coupled between the control terminal of the first transistor and the node. The input terminal of the inverter circuit is coupled to the control terminal of the first switch. The second capacitor is coupled between the node and the output terminal of the inverter circuit.

10 Claims, 5 Drawing Sheets

BOOTSTRAPPED SWITCH

BACKGROUND OF THE INVENTION

1. Field of the Invention

The present invention generally relates to bootstrapped switches, and, more particularly, to bootstrapped switches that are turned on and off rapidly.

2. Description of Related Art

FIG. 1 is a circuit diagram of a conventional bootstrapped switch. The bootstrapped switch 10 includes a switch 101, a switch 102, a switch 103, a switch 104, a switch 105, and an N-channel metal-oxide-semiconductor field-effect transistor (N-channel MOSFET, hereinafter referred to as NMOS transistor) 106, and a bootstrap capacitor 107. The input terminal VI and the output terminal VO of the bootstrapped switch 10 are respectively coupled to the source and drain of the NMOS transistor 106. The gate of the NMOS transistor 106 is coupled to the voltage source V3 through the switch 105 as well as coupled to one terminal of the bootstrap capacitor 107 and one terminal of the switch 101 through the switch 104. The other terminal of the switch 101 is coupled to the voltage source V1. The other terminal of the bootstrap capacitor 107 is coupled to the voltage source V2 through the switch 102 and coupled to the source of the NMOS transistor 106 and the input terminal VI of the bootstrapped switch 10 through the switch 103. The voltage source V1 is at a high voltage level VDD, while the voltage source V2 and the voltage source V3 are at the ground level. The operation of the bootstrapped switch 10 is known to people having ordinary skill in the art and thus omitted for brevity.

The state of the switch 105 (being turned on or off) determines the state of the NMOS transistor 106 (being turned on or off). In other words, when a response time of the switch 105 is shorter (i.e., the gate of the NMOS transistor 106 is driven to reach the target voltage faster), the state of the NMOS transistor 106 is more in line with the system clock, which means that the bootstrapped switch 10 performs better (e.g., operating faster and generating more accurate samplings). In other words, the design of the switch 105 is crucial to the performance of the bootstrapped switch 10.

SUMMARY OF THE INVENTION

In view of the issues of the prior art, an object of the present invention is to provide bootstrapped switches, so as to make an improvement to the prior art.

According to one aspect of the present invention, a bootstrapped switch that receives an input voltage and outputs an output voltage is provided. The bootstrapped switch includes a first transistor, a first capacitor, a second transistor, a first switch, a second switch, a third switch, a fourth switch, a fifth switch, an inverter circuit, and a second capacitor. The first transistor has a first terminal, a second terminal, and a first control terminal. The first transistor receives the input voltage at the first terminal and outputs the output voltage at the second terminal. The first capacitor has a third terminal and a fourth terminal. The second transistor has a fifth terminal, a sixth terminal, and a second control terminal. The second transistor receives the input voltage at the fifth terminal. The sixth terminal is electrically connected to the third terminal of the first capacitor. The second control terminal is electrically connected to the first control terminal of the first transistor. The first switch is coupled between the third terminal of the first capacitor and a first reference voltage. The second switch is coupled between the fourth terminal of the first capacitor and a second reference voltage. The third switch is coupled between the fourth terminal of the first capacitor and the first control terminal of the first transistor. The fourth switch is coupled between the first control terminal of the first transistor and a node. The fifth switch has a third control terminal and is coupled between the node and the first reference voltage. The inverter circuit has an input terminal and an output terminal. The input terminal is coupled to the third control terminal of the fifth switch, and the inverter circuit inverts a voltage at the third control terminal. The second capacitor has a seventh terminal and an eighth terminal. The seventh terminal is coupled to the output terminal of the inverter circuit, and the eighth terminal is coupled to the node.

The bootstrapped switches of the present invention can be turned on and/or off rapidly. In comparison with the prior art, the bootstrapped switches of the present invention can operate at a higher speed.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes bootstrapped switches. On account of that some or all elements of the bootstrapped switches could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
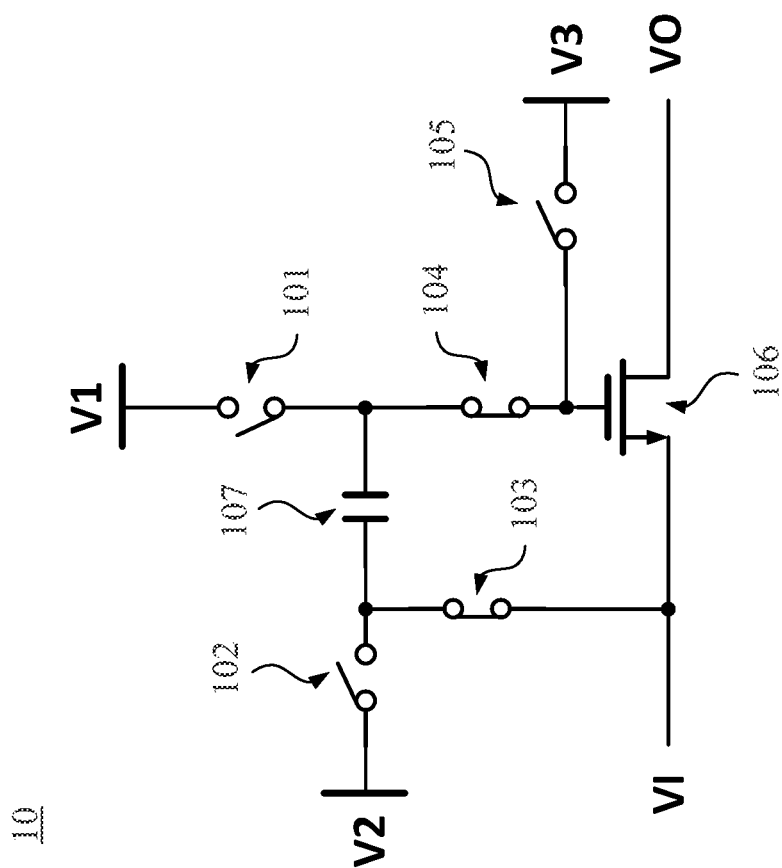
FIG. 1 is a circuit diagram of a conventional bootstrapped switch.
Figure 2:
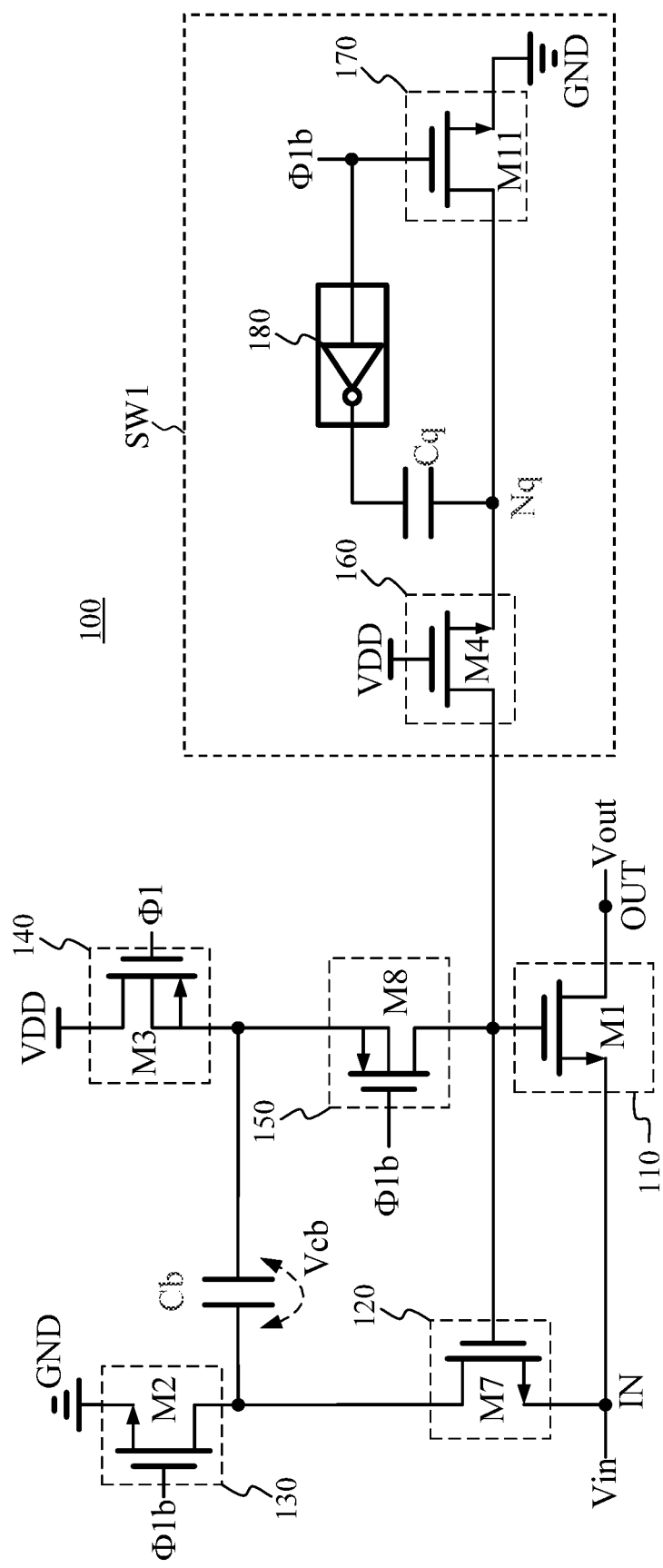
FIG. 2 is a circuit diagram of the bootstrapped switch according to an embodiment of the present invention.

FIG. 2 is a circuit diagram of a bootstrapped switch according to an embodiment of the present invention. The bootstrapped switch 100 receives the input voltage Vin at the input terminal IN and outputs the output voltage Vout at the output terminal OUT. The bootstrapped switch 100 includes a switch 110, a switch 120, a switch 130, a switch 140, a switch 150, a switch 160, a switch 170, a bootstrap capacitor Cb, a capacitor Cq, and an inverter circuit 180. The switch circuit SW1 corresponds to the switch 105 of FIG. 1. The switch 110, the switch 120, the switch 130, the switch 140, the switch 150, the switch 160, and the switch 170 can be respectively embodied by a transistor M1, a transistor M7, a transistor M2, a transistor M3, a transistor M8, a transistor M4, and a transistor M11. Each transistor has a first terminal, a second terminal, and a control terminal, and the first terminal and the second terminal are two terminals of a switch embodied by the transistor. For Metal-Oxide-Semiconductor Field-Effect Transistors (MOSFETs), the first terminal can be one of the source and the drain, the second terminal can be the other of the source and the drain, and the control terminal is the gate. For bipolar junction transistors (BJTs), the first terminal can be one of the collector and the emitter, the second terminal can be the other one of the collector and the emitter, and the control terminal is the base.

As shown in FIG. 2, the control terminal of the transistor M1 and the control terminal of the transistor M7 are electrically connected to each other. The transistor M1 receives the input voltage Vin at its first terminal, and outputs the output voltage Vout at its second terminal. The first terminal of the transistor M7 receives the input voltage Vin, and the second terminal of the transistor M7 is electrically connected to the first terminal of the bootstrap capacitor Cb. The first terminal of the transistor M2 is coupled to the first terminal of the bootstrap capacitor Cb, and the second terminal of the transistor M2 is coupled to the first reference voltage (the ground level GND in the example of FIG. 2). The first terminal of the transistor M3 is coupled to the second reference voltage (the power supply voltage VDD in the example of FIG. 2, which is higher than the ground level GND), and the second terminal of the transistor M3 is coupled to the second terminal of the bootstrap capacitor Cb. The first terminal of the transistor M8 is coupled to the control terminal of the transistor M1, and the second terminal of the transistor M8 is coupled to the second terminal of the bootstrap capacitor Cb. The first terminal of the transistor M4 is coupled or electrically connected to the control terminal of the transistor M1 and the control terminal of the transistor M7, the control terminal of the transistor M4 is coupled or electrically connected to the power supply voltage VDD, and the second terminal of the transistor M4 is coupled or electrically connected to the node Nq. The first terminal of the transistor M11 is coupled or electrically connected to the node Nq, and the second terminal of the transistor M11 is coupled or electrically connected to the first reference voltage (the ground level GND). The control terminal of the transistor M11 receives the clock $\Phi 1b$. The first terminal of the capacitor Cq is coupled or electrically connected to the node Nq. The input terminal of the inverter circuit 180 receives the clock $\Phi 1b$, and the output terminal of the inverter circuit 180 is coupled or electrically connected to the second terminal of the capacitor Cq.

Figure 3:
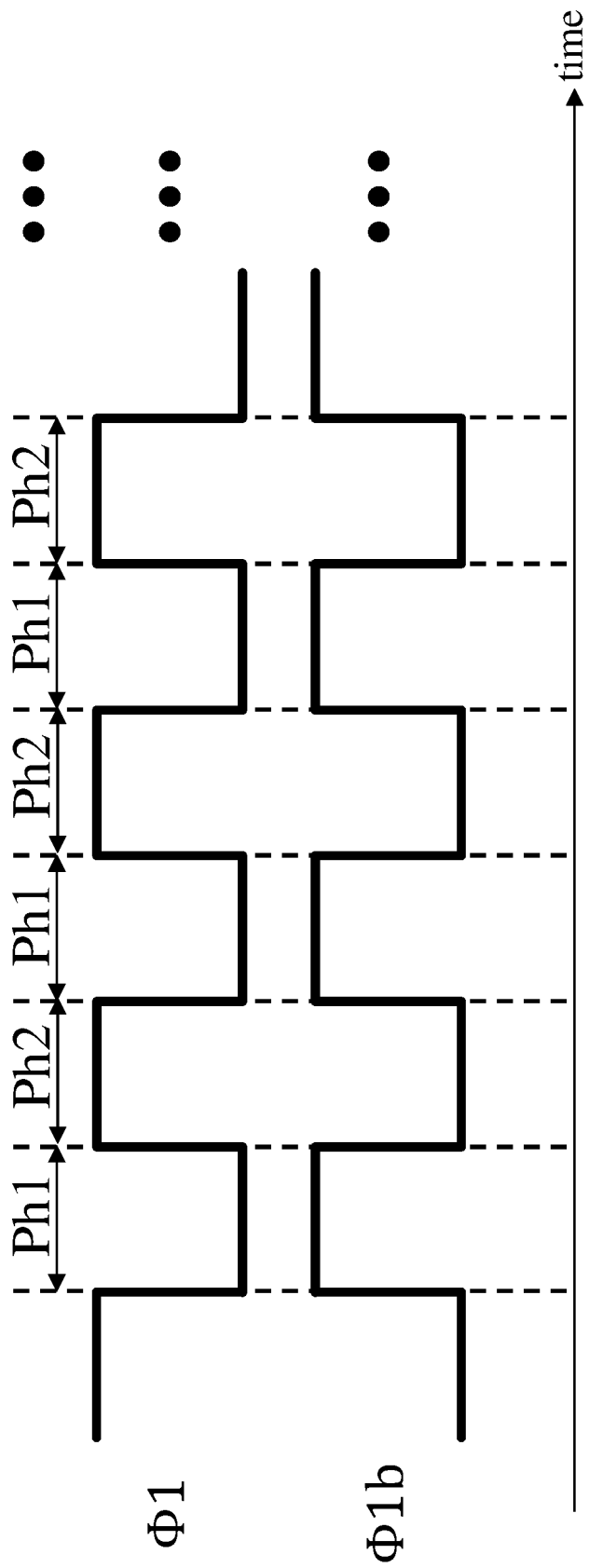
FIG. 3 shows an example of the clock $\Phi 1$ and the clock (Mb.

The switch 130, the switch 140, the switch 150, and the switch 170 are turned on (the corresponding transistor is turned on) or off (the corresponding transistor is turned off) according to the clock $\Phi 1$ and the clock $\Phi 1b$. FIG. 3 shows an example of the clock $\Phi 1$ and the clock $\Phi 1b$, which are each other's inverted signal. Controlled by the clock $\Phi 1$ and the clock $\Phi 1b$, the bootstrapped switch 100 operates alternately in the first clock phase Ph1 (the period when the clock $\Phi 1$ is at the first level (e.g., the low level) and the clock $\Phi 1b$ is at the second level (e.g., the high level)) and the second clock phase Ph2 (the period when the clock $\Phi 1$ is at the second level and the clock $\Phi 1b$ is at the first level). The operational details of the bootstrapped switch 100 are discussed below.

Reference is made to FIGS. 2 and 3. In the first clock phase Ph1 (when the clock $\Phi 1$ is at the low level and the clock $\Phi 1b$ is at the high level), the switch 130, the switch 140, the switch 160, and the switch 170 are turned on, and the switch 150 is turned off. When the switch 160 and the switch 170 are turned on, the voltage at the control terminal of the transistor M1 and the control terminal of the transistor M7 is substantially equal to the first reference voltage (the ground level GND), driving the switch 110 and the switch 120 to be off; in other words, the switch 110 and the switch 120 are turned off in the first clock phase Ph1. When the switch 130 and the switch 140 are turned on, the voltages at the two terminals of the bootstrap capacitor Cb are substantially the first reference voltage (the ground level GND) and the second reference voltage (the power supply voltage VDD), respectively; in other words, the bootstrap capacitor Cb is charged in the first clock phase Ph1, and the voltage Vcb across the bootstrap capacitor Cb after the first clock phase Ph1 ends is substantially equal to the voltage difference between the first reference voltage and the second reference voltage.

In the second clock phase Ph2 (when the clock $\Phi 1$ is at the high level and the clock $\Phi 1b$ is at the low level), the switch 130, the switch 140, the switch 160, and the switch 170 are turned off, and the switch 150 is turned on. When the switch 150 is turned on, the electric potential at the control terminals of the transistor M1 and the transistor M7 is substantially equal to the electric potential at the second terminal of the bootstrap capacitor Cb; as a result, the transistor M1 and the transistor M7 are turned on due to the voltage Vcb across the bootstrap capacitor Cb. When the transistor M7 is turned on, the voltage at the second terminal of the bootstrap capacitor Cb and the control terminal of the transistor M1 is substantially equal to the sum of the input voltage Vin and the voltage Vcb across the bootstrap capacitor Cb. When the transistor M1 is turned on, the output voltage Vout is substantially equal to the input voltage Vin; namely, the bootstrapped switch 100 is turned on.

In some circumstances, the voltage at the control terminal of the transistor M1 may be greater than the power supply voltage VDD (sometimes even close to twice the power supply voltage VDD), and meanwhile the transistor M11 may be in a state that its control terminal (gate) and second terminal (source) are both connected to the ground level GND. In some related technologies, if the first terminal (drain) of the transistor M11 is directly electrically connected to the transistor M1, the service life of the transistor M11 is greatly reduced due to the high voltage at the control terminal of the transistor M1 (which, as discussed above, can be nearly twice as high as the power supply voltage VDD). One of the purposes of the transistor M4 of the present invention is to solve this problem by separating the control terminal of the transistor M1 and the transistor M11, thus preventing the first terminal of the transistor M11 from being subjected to this high voltage. The transistor M4 can withstand this high voltage because the control terminal of the transistor M4 is coupled or electrically connected to the power supply voltage VDD, ensuring that the voltages between the first terminal, the second terminal, and the control terminal of the transistor M4 are all smaller than the power supply voltage VDD. Unfortunately, the transistor M4 slows down the voltage transition (from the second level (e.g., the high level) to the first level (e.g., the low level)) at the control terminal of the transistor M1, hindering the bootstrapped switch 100 from being immediately turned off after entering the first clock phase Ph1. In other words, the transistor M4 may decrease the switching speed of the bootstrapped switch 100.

One of the purposes of the capacitor Cq and the inverter circuit 180 is to rapidly pull up or pull down the voltage at the node Nq to improve the switching speed of the transistor M4 (i.e., increasing the voltage transition speed at the control terminal of the transistor M1, which is equivalent to boosting the switching speed of the bootstrapped switch 100).

When the clock Φ$Mb$ transitions from the first level to the second level (the transistor M11 starts to be turned on but has not yet been completely turned on), the inverter circuit 180 outputs an output signal that is an inverted signal of the clock Φ$Mb$ (i.e., the output signal is a signal of the first level), and then the output signal is coupled to the node Nq through the capacitor Cq. As a result, the voltage at the node Nq may start to decrease before the transistor M11 is completely turned on. Once the voltage at the node Nq starts to decrease, the voltage difference between the first terminal and the second terminal of the transistor M4 increases, enhancing the turn-on capability the transistor M4. In other words, the inverter circuit 180 and the capacitor Cq are of great help in the early turn on of the transistor M4, which in turn causes the voltage at the control terminal of the transistor M1 to decrease faster (i.e., to increase the turn-off speed the bootstrapped switch 100).

When the clock Φ$Mb$ transitions from the second level to the first level (the transistor M11 starts to be turned off but has not yet been completely turned off), the inverter circuit 180 outputs an output signal that is an inverted signal of the clock Φ$Mb$ (i.e., the output signal is a signal of the second level), and then the output signal is coupled to the node Nq through the capacitor Cq. As a result, the voltage at the node Nq may start to rise before the transistor M11 is completely turned off. Once the voltage at the node Nq starts to rise, the voltage at the control terminal of the transistor M1 is pulled up through the transistor M4. In other words, the inverter circuit 180 and the capacitor Cq can drive the voltage at the control terminal of the transistor M1 to rise faster (i.e., increase the turn-on speed of the bootstrapped switch 100).

Figure 4:
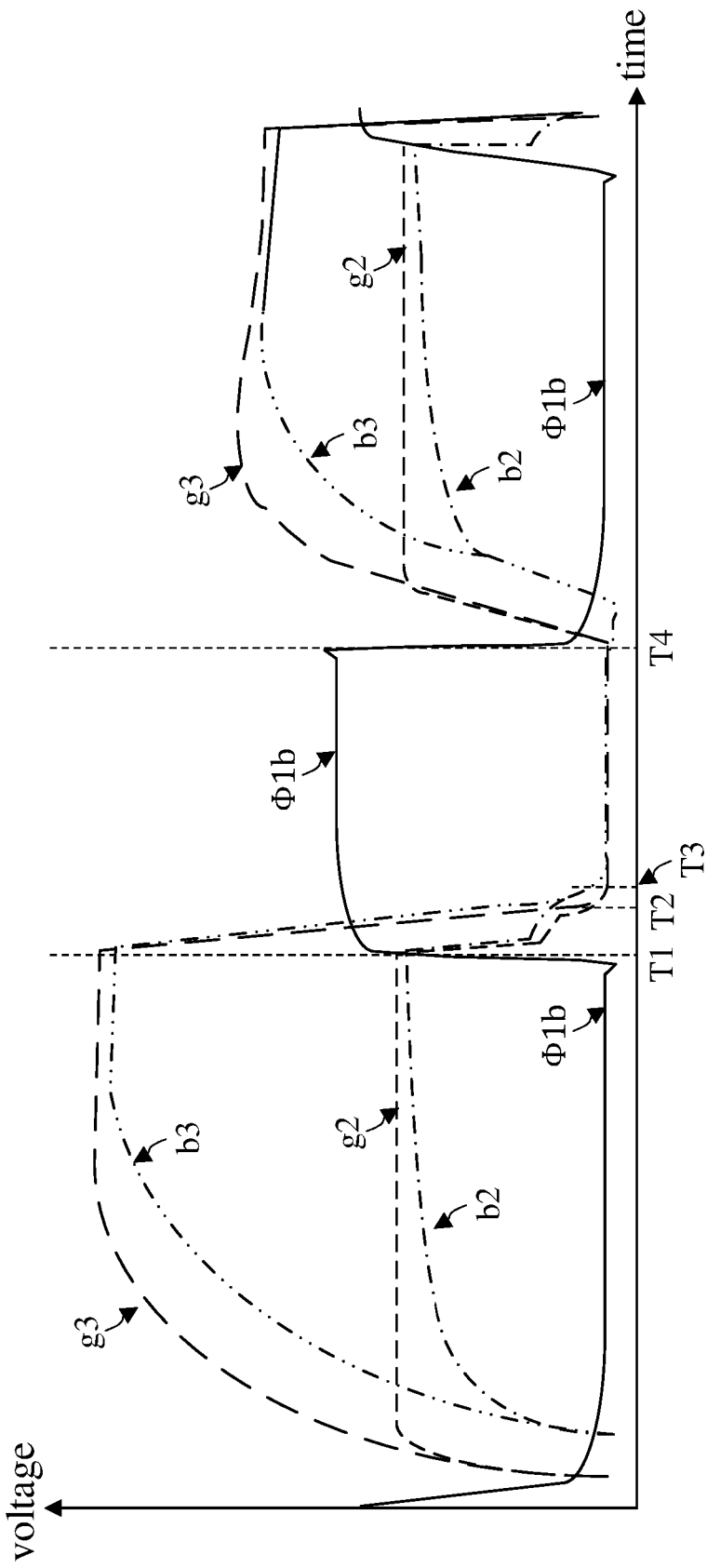
FIG. 4 is a simulation of the voltage at the node Nq and the voltage at the control terminal of the transistor M1.

FIG. 4 is a simulation of the voltage at the node Nq and the voltage at the control terminal of the transistor M1. The curve g2 and the curve b2 represent the voltage at the node Nq, while the curve g3 and the curve b3 represent the voltage at the control terminal of the transistor M1. The curve g2 and curve g3 correspond to the bootstrapped switch that includes the inverter circuit 180 and the capacitor Cq (e.g., the bootstrapped switch 100 of FIG. 2), while curve b2 and curve b3 correspond to a bootstrapped switch that does not include the inverter circuit 180 and the capacitor Cq (e.g., the circuit of FIG. 2 with the inverter circuit 180 and the capacitor Cq removed). It can be observed from FIG. 4 that when the clock Φ1$b$ transitions from the first level to the second level (e.g., at the time point T1), the curve g3 drops faster than the curve b3 (the slope of the curve g3 is greater than the slope of the curve b3), that is, the voltage at the control terminal of the transistor M1 reaches the first level early by about T3-T2. When the clock Φ1$b$ transitions from the second level to the first level (e.g., at the time point T4), the curve g3 starts to rise earlier than the curve b3, that is, the bootstrapped switch 100 is turned on more rapidly. Similar trend can be seen on the voltage at the node Nq, and the detail is thus omitted for brevity.

In some embodiments, the inverter circuit 180 includes an odd number of inverters, and the capacitance value of the capacitor Cq may be about tens to hundreds of femtofarads (fF), preferably between 10 fF and 100 fF. The capacitance value of the capacitor Cq is also a trade-off, because if the capacitance value of the capacitor Cq is too large, the size of the inverter circuit 180 will be increased, resulting in a slower operating speed of the added inverter circuit 180 and the capacitor Cq than the transistor M11.

Figure 5:
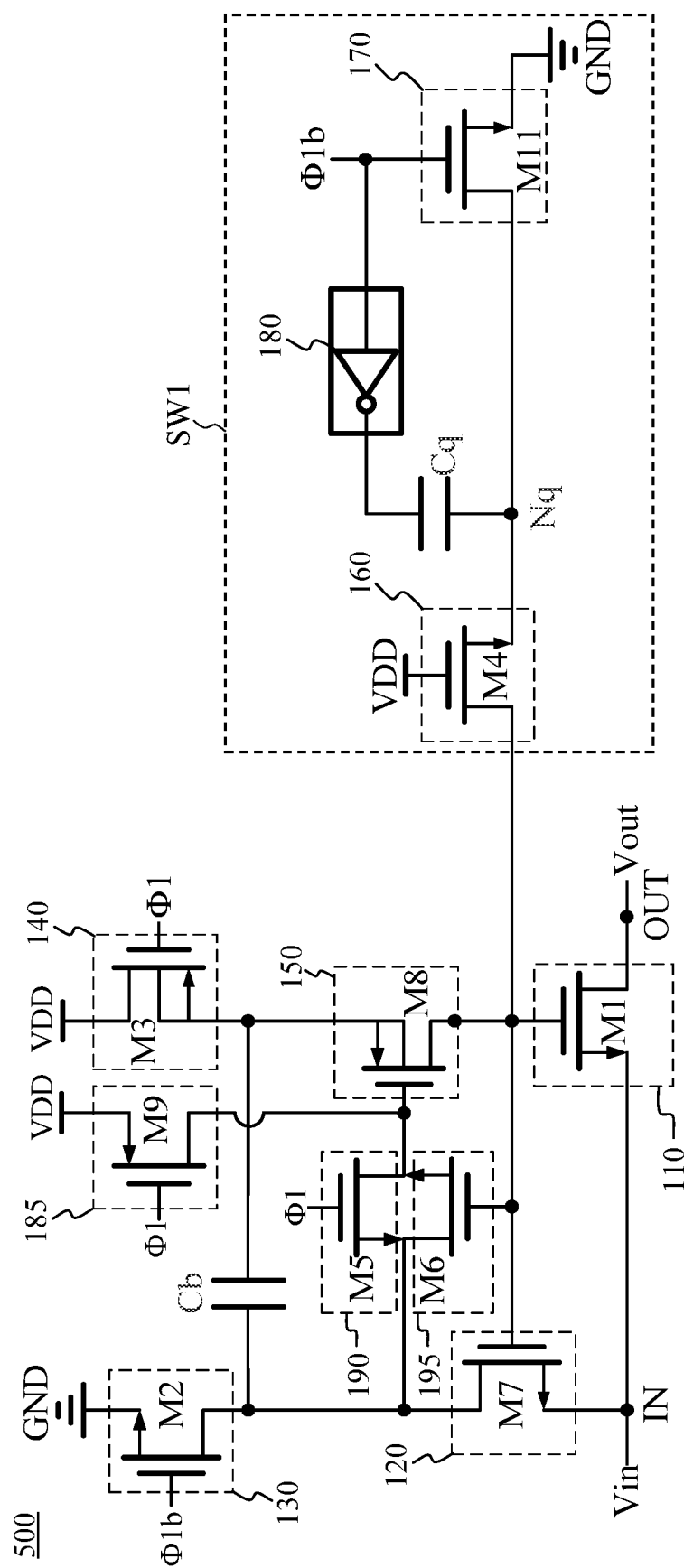
FIG. 5 is a circuit diagram of a bootstrapped switch according to another embodiment of the present invention.

FIG. 5 is a circuit diagram of a bootstrapped switch according to another embodiment of the present invention. The bootstrapped switch 500 is similar to the bootstrapped switch 100, except that the bootstrapped switch 500 further includes a switch 185, a switch 190, and a switch 195. The switch 185, the switch 190, and the switch 195 are embodied by the transistor M9, the transistor M5, and the transistor M6, respectively. The switch 185 is coupled between the second reference voltage and the control terminal of the transistor M8, and is controlled by the clock Φ1. The switch 190 is coupled between the first terminal of the bootstrap capacitor Cb and the control terminal of the transistor M8, and is controlled by the clock Φ1. The switch 195 is coupled between the first terminal of the bootstrap capacitor Cb and the control terminal of the transistor M8, and the control terminal of the transistor M6 is electrically connected to the control terminal of the transistor M1 and the control terminal of the transistor M7. The transistor M5, the transistor M6, and the transistor M9 can provide overvoltage protection during the operation of the bootstrapped switch 500 to prolong the service life of the components. The operating principals of the transistor M5, the transistor M6, and the transistor M9 can be understood by people having ordinary skill in the art and are thus omitted for brevity.

To sum up, the inverter circuit 180 and the capacitor Cq have the effect of causing the voltage at the node Nq and the voltage at the control terminal of the transistor M1 to rise or fall early and/or rapidly, so that the bootstrapped switch has a more rapid response speed (i.e., can operate at a higher speed).

In other embodiments, the PMOS transistors and the NMOS transistors in the foregoing embodiments may be replaced by the NMOS transistors and PMOS transistors, respectively. People having ordinary skill in the art know how to realize the embodiments discussed above by adjusting the phase or level of the clock Φ1 and the clock Φ1$b$ accordingly and adjusting the first reference voltage and the second reference voltage accordingly.

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:
1. A bootstrapped switch that receives an input voltage and outputs an output voltage, comprising:
   a first transistor having a first terminal, a second terminal, and a first control terminal, wherein the first transistor receives the input voltage at the first terminal and outputs the output voltage at the second terminal;
   a first capacitor having a third terminal and a fourth terminal;

a second transistor having a fifth terminal, a sixth terminal, and a second control terminal, wherein the second transistor receives the input voltage at the fifth terminal, the sixth terminal is electrically connected to the third terminal of the first capacitor, and the second control terminal is electrically connected to the first control terminal of the first transistor;

a first switch coupled between the third terminal of the first capacitor and a first reference voltage;

a second switch coupled between the fourth terminal of the first capacitor and a second reference voltage;

a third switch coupled between the fourth terminal of the first capacitor and the first control terminal of the first transistor;

a fourth switch coupled between the first control terminal of the first transistor and a node;

a fifth switch having a third control terminal and is coupled between the node and the first reference voltage;

an inverter circuit having an input terminal and an output terminal, wherein the input terminal is coupled to the third control terminal of the fifth switch, and the inverter circuit inverts a voltage at the third control terminal; and a second capacitor having a seventh terminal and an eighth terminal, wherein the seventh terminal is coupled to the output terminal of the inverter circuit, and the eighth terminal is coupled to the node.

2. The bootstrapped switch of claim 1, wherein in a first clock phase, the first switch, the second switch, the fourth switch, and the fifth switch are turned on and the third switch is turned off to charge the first capacitor; in a second clock phase, the third switch is turned on and the first switch, the second switch, the fourth switch, and the fifth switch are turned off.

3. The bootstrapped switch of claim 1, wherein the fourth switch has a fourth control terminal, and the fourth control terminal is electrically connected to the second reference voltage.

4. The bootstrapped switch of claim 1, wherein the inverter circuit comprises an odd number of inverters.

5. The bootstrapped switch of claim 1, wherein a capacitance value of the second capacitor is between 10 fF and 100 fF.

6. A bootstrapped switch that receives an input voltage and outputs an output voltage, comprising:

a first transistor having a first terminal, a second terminal, and a first control terminal, wherein the first transistor receives the input voltage at the first terminal and outputs the output voltage at the second terminal;

a first capacitor having a third terminal and a fourth terminal;

a second transistor having a fifth terminal, a sixth terminal, and a second control terminal, wherein the second transistor receives the input voltage at the fifth terminal, the sixth terminal is electrically connected to the third terminal of the first capacitor, and the second control terminal is electrically connected to the first control terminal of the first transistor;

a first switch coupled between the third terminal of the first capacitor and a first reference voltage;

a second switch coupled between the fourth terminal of the first capacitor and a second reference voltage;

a third switch coupled between the fourth terminal of the first capacitor and the first control terminal of the first transistor;

a fourth switch coupled between the first control terminal of the first transistor and a node;

a fifth switch having a third control terminal and is coupled between the node and the first reference voltage;

an inverter circuit having an input terminal and an output terminal, wherein the input terminal is coupled to the third control terminal of the fifth switch, when the third control terminal is at a low level, the output terminal is at a high level, and when the third control terminal is at the high level, the output terminal is at the low level; and a second capacitor having a seventh terminal and an eighth terminal, wherein the seventh terminal is coupled to the output terminal of the inverter circuit, and the eighth terminal is coupled to the node.

7. The bootstrapped switch of claim 6, wherein in a first clock phase, the first switch, the second switch, the fourth switch, and the fifth switch are turned on and the third switch is turned off to charge the first capacitor; in a second clock phase, the third switch is turned on and the first switch, the second switch, the fourth switch, and the fifth switch are turned off.

8. The bootstrapped switch of claim 6, wherein the fourth switch has a fourth control terminal, and the fourth control terminal is electrically connected to the second reference voltage.

9. The bootstrapped switch of claim 6, wherein the inverter circuit comprises an odd number of inverters.

10. The bootstrapped switch of claim 6, wherein a capacitance value of the second capacitor is between 10 fF and 100 fF.

* * * * *